US010937704B1

(12) United States Patent
Chiang et al.

(10) Patent No.: US 10,937,704 B1
(45) Date of Patent: Mar. 2, 2021

(54) MIXED WORKFUNCTION METAL FOR NANOSHEET DEVICE

(71) Applicant: Taiwan Semiconductor Manufacturing Co., Ltd., Hsin-Chu (TW)

(72) Inventors: Kuo-Cheng Chiang, Hsinchu County (TW); Chung-Wei Hsu, Hsinchu County (TW); Lung-Kun Chu, New Taipei (TW); Jia-Ni Yu, New Taipei (TW); Chih-Hao Wang, Hsinchu County (TW); Mao-Lin Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/590,177

(22) Filed: Oct. 1, 2019

(51) Int. Cl.
*H01L 21/8238* (2006.01)
*H01L 27/092* (2006.01)
*H01L 21/3213* (2006.01)

(52) U.S. Cl.
CPC ........... *H01L 21/823842* (2013.01); *H01L 21/823821* (2013.01); *H01L 27/0924* (2013.01); *H01L 21/32134* (2013.01)

(58) Field of Classification Search
CPC .............................................. H01L 21/823842
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2020/0105758 A1* | 4/2020 | Ching ............... H01L 29/78696 |

(Continued)

*Primary Examiner* — Douglas M Menz
(74) *Attorney, Agent, or Firm* — Haynes and Boone, LLP

(57) ABSTRACT

A method includes depositing a first conductive material on a first-type channel stack and a second-type channel stack, the first conductive material having a first workfunction, the first conductive material being formed between multiple layers of both the first-type channel stack and the second-type channel stack. The method further includes partially removing the first conductive material from the second-type channel stack such that the first conductive material remains between the multiple layers of both the first-type channel stack and the second-type channel stack and fully removing the first conductive material from the second-type channel stack. The method further includes depositing a second conductive material over both the first-type channel stack and the second-type channel stack such that the second conductive material covers both the first-type channel stack and the first conductive material in between the layers of the first-type channel stack, the second conductive material having a second workfunction that is different than the first workfunction.

20 Claims, 8 Drawing Sheets

(56) References Cited

U.S. PATENT DOCUMENTS

| 2020/0135729 | A1* | 4/2020 | Ng | H01L 29/42392 |
| 2020/0273757 | A1* | 8/2020 | Ng | H01L 29/42392 |
| 2020/0294863 | A1* | 9/2020 | Chiang | H01L 29/4966 |

* cited by examiner

MIXED WORKFUNCTION METAL FOR NANOSHEET DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
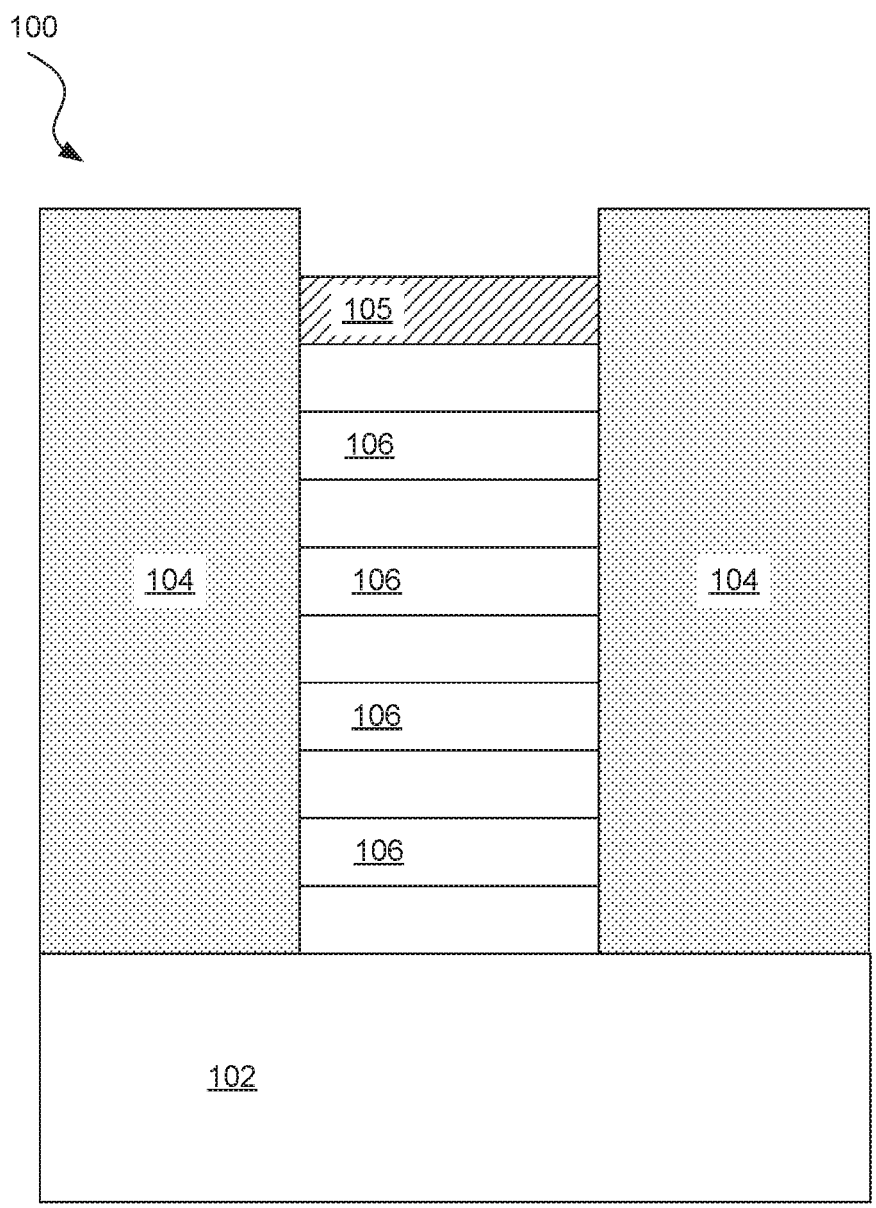
FIGS. 1A and 1B are diagrams showing a cross-sectional view of an illustrative nanostructure device, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

In some example embodiments, to form a GAA device, a semiconductor fin may include a total of three to ten alternating layers of semiconductor materials; of course, the present disclosure is not limited to such configuration. In the present disclosure, the first semiconductor material includes Si, while the second semiconductor material includes SiGe. Either of the semiconductor materials and (or both) may be doped with a suitable dopant, such as a p-type dopant or an n-type dopant, for forming desired FETs. The semiconductor materials and may each be formed by an epitaxial process, such as, for example, a molecular beam epitaxy (MBE) process, a CVD process, and/or other suitable epitaxial growth processes.

In many embodiments, alternating layers of the semiconductor materials and 204B are configured to provide nanowire or nanosheet devices such as GAA FETs, the details of forming which are provided below. GAA FETs have been introduced in effort to improve gate control by increasing gate-channel coupling, reduce OFF-state current, and reduce short-channel effects. A multi-gate device such as a GAA FET generally includes a gate structure that extends around its channel region (horizontal or vertical), providing access to the channel region on all sides. The GAA FETs are generally compatible with CMOS processes, allowing them to be aggressively scaled down while maintaining gate control and mitigating short-channel effects. Of course, the present disclosure is not limited to forming GAA FETs only and may provide other three-dimensional FETs such as FinFETs.

In a GAA device, a channel stack is formed by depositing alternating layers of material that may be selectively etched. For example, a first type of semiconductor material may be epitaxially grown within a space formed between two active regions. Then, a second type of semiconductor material may be epitaxially grown. The process continues by forming alternating layers of the first and second semiconductor material. Then, a first etching process (e.g., a dry etching process) is used to cut the channel stack and expose each layer of the channel stack. Then, a second etching process (e.g., a wet etching process) can be used to remove the first semiconductor material while leaving the second semiconductor material substantially intact. The remaining second semiconductor material may thus form a stack of nanowires or nanosheets extending between two active regions.

Transistor devices include p-type and n-type transistors. Different transistor types have different workfunction metals. For example, in the context of GAA devices, a conventional first-type device such as a p-type device will have a p-type workfunction metal surrounding the channels and a conventional second-type device such as an n-type device will have an n-type workfunction metal surrounding the channels. During the fabrication of n-type and p-type devices, the etching processes used to remove material from between the channels of the n-type device may inadvertently damage material surrounding the p-type device. The principles described herein avoid this issue.

According to principles described herein, a first conductive material (e.g., p-type workfunction metal) is deposited on both a p-type channel stack and an n-type channel stack. The first conductive material is formed between multiple layers of both the p-type channel stack and the n-type channel stack. Thereafter, the first conductive material is partially removed from the n-type channel stack such that the first conductive material remains between the multiple layers of both the p-type channel stack and the n-type channel stack, but is removed from the outer portion. Then, the p-type channel stack is covered with a photoresist and the first conductive material is fully removed from the n-type channel stack. The first conductive material remains between the channels of the p-type stack. Then, a second conductive material is deposited over both the p-type channel stack and the n-type channel stack such that the second conductive material covers both the p-type channel stack and the first conductive material in between the layers of the p-type channel stack. Thus, the p-type channel stack has n-type workfunction metal between the channels but the p-type channel stack is surrounded by p-type workfunction metal.

FIG. 1A is a diagram showing a cross-sectional view of an illustrative nanostructure device 100 after a plurality of nanostructures in the form of channels 106 have been formed. According to the present example, the nanostructure device 100 includes active regions 104 (such as source/drain devices) disposed on a semiconductor substrate 102. A plurality of channels 106 extend between the active regions. The channels 106 may take the form of nanowires or nanosheets.

A hardmask layer 105 extends between the active regions on a top of the channel stack. The hardmask layer 105 may include at least one of silicon oxide (SiO2), silicon nitride (SiN), silicon carbide (SiC), silicon oxynitride (SiON), silicon oxycarbide (SiOCN), hafnium oxide (HfO2), aluminum oxide (Al2O3), and zirconium oxide (ZrO2). Other materials are contemplated.

The semiconductor substrate 102 may be a silicon substrate. The semiconductor substrate may be part of a silicon wafer. Other semiconductor materials are contemplated. The active regions 104 may be a semiconductor that is doped to create the desired properties for source/drain regions of the transistor. The substrate 102 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

The channels 106 may be formed using various techniques used to form GAA devices. For example, the channels may be formed by depositing a first type of semiconductor material within the space between the two active regions. Then, a second type of semiconductor material may be epitaxially grown. The process continues by forming alternating layers of the first and second semiconductor material. Then, a first etching process (e.g., a dry etching process) is used to cut the channel stack and expose each layer of the channel stack. Then, a second etching process (e.g., a wet etching process) can be used to remove the first semiconductor material while leaving the second semiconductor material substantially intact. The remaining second semiconductor material may thus form a stack of nanowires or nanosheets extending between two active regions. The channels may include at least one of the following materials: silicon (Si), silicon germanium (SiGe), germanium (Ge), gallium arsenic (GaAs), and indium phosphorous (InP).

Figure 1B:
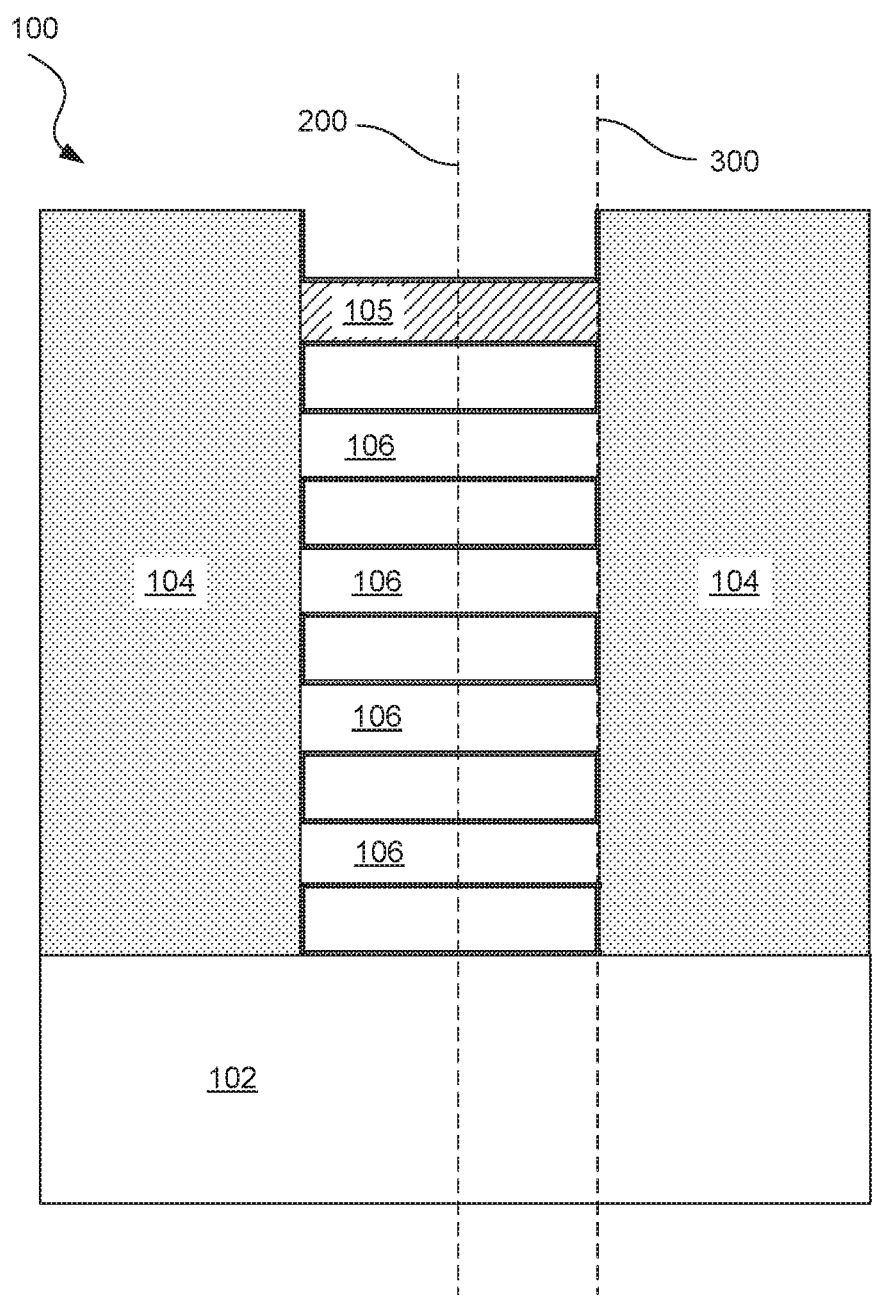

FIG. 1B illustrates the formation of a first conductive material 202 around the nanostructure device channels 106 and along the sidewalls of the active regions 104. The first conductive material may be a p-type workfunction metal. Such metal is designed to give p-type metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc.

FIG. 1B also illustrates two cut-points 200, 300. The first cut-point 200 is along the center of the channels 106. The view along the first cut-point is shown in FIGS. 3A-3D. The second cut-point 300 is along the sidewalls of the active region 104. The view along the second cut-point is shown in FIG. 2, after a first conductive material 202 is formed along the sidewalls.

Figure 2:
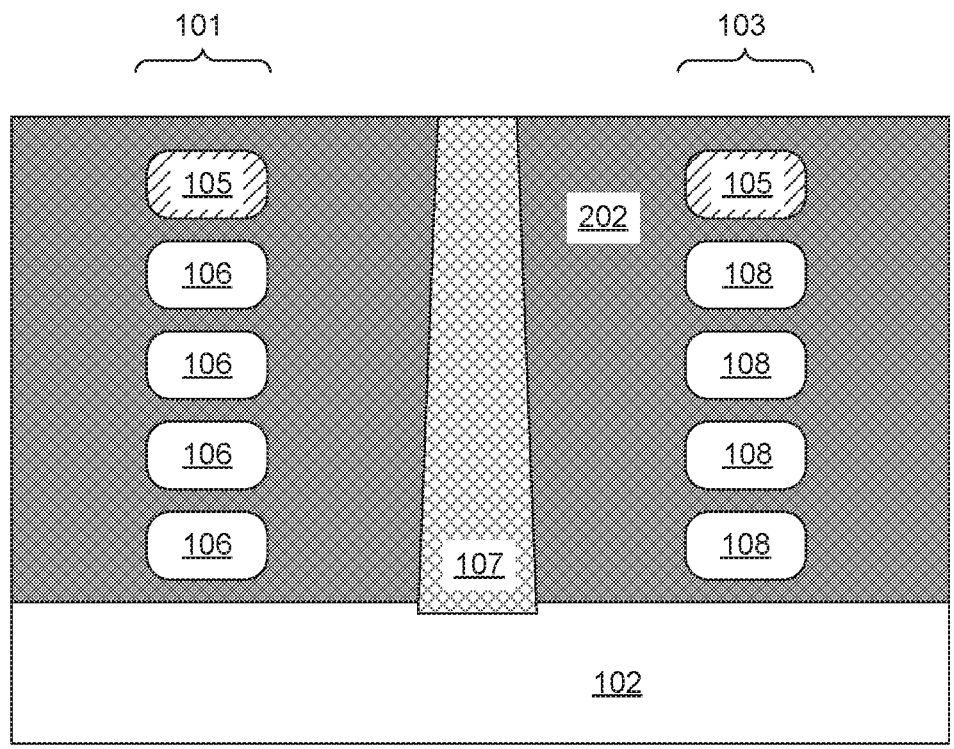
FIG. 2 is a diagram showing a different cross-sectional view of the nanostructure device along sidewalls, according to one example of principles described herein.

FIG. 2 is a diagram showing a different cross-sectional view of the nanostructure device along sidewalls of the active regions 102. FIG. 2 illustrates a p-type channel stack 101 and an n-type channel stack 103. The p-type channel stack 101 includes a stack of nanostructures 106. The n-type channel stack 103 includes a stack of nanostructure 108. The n-type channel stack 103 is separated from the p-type channel stack 101 by a boundary structure 107. The boundary structure 107 may include a low-k dielectric material. For example, the boundary structure 107 may include one of silicon nitride (SiN), silicon carbon nitride (SiCN), or silicon oxycarbide (SiOCN). Other materials may be used as well. For example, other materials with a dielectric constant less than 7 may be used.

FIG. 2 also illustrates a first conductive material 202 formed around the channel structures 106, 108. The first conductive material 202 covers the sidewall and is shown in such in the sidewall cut-point 200 view of FIG. 2. The first conductive material may be a p-type workfunction metal. Such metal is designed to give p-type metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), ruthenium (Ru), molybdenum (Mo), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. The conductive material 202 may be formed by any suitable method, such as CVD, ALD, PVD, plating, chemical oxidation, thermal oxidation, other suitable methods, or combinations thereof. Thereafter, one or more polishing processes (e.g., CMP) to remove any excess conductive materials and planarize the top surface of the device may be performed.

FIGS. 3A-3D are diagrams showing an illustrative process for forming a nanostructure device with mixed metal structures. Like FIG. 2, FIG. 3A also illustrates the first conductive material 202. The first conductive material 202 surrounds the channel structures 106, 108.

Figure 3A:
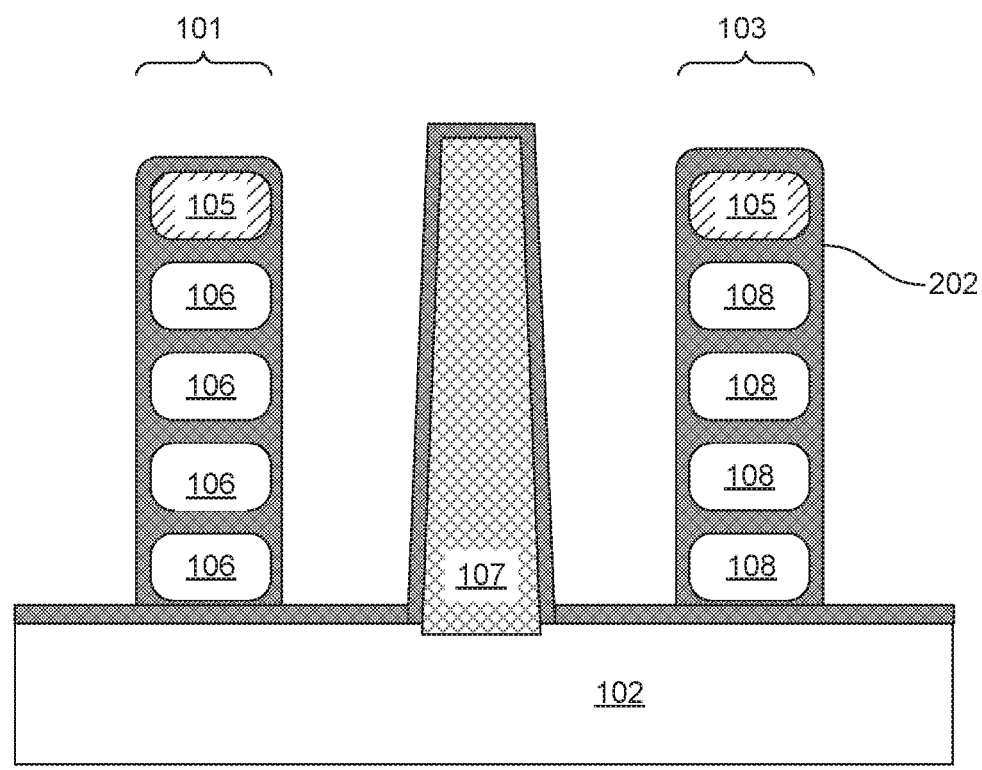
FIGS. 3A-3D are diagrams showing an illustrative process for forming a nanostructure device with mixed metal structures, according to one example of principles described herein.
Figure 3B:
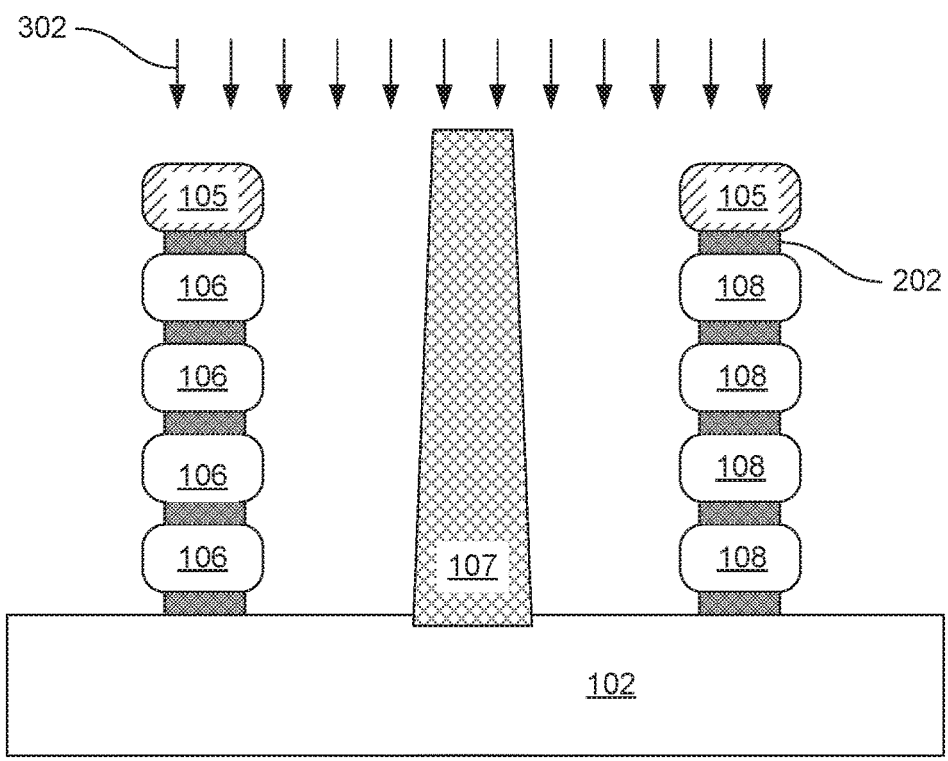

FIG. 3B illustrates a first etching process 302 to partially remove the first conductive material 202. The etching process 302 may be an isotropic etching process such as a wet etching process. The etching process 302 is applied long enough to remove the first conductive material around the outsides of the channels 106, 108 but not long enough to remove it from between the channels. As can be seen, the first conductive material 202 remains in the spaces between the channels 106, 108. The wet etching process may use an acid-based etchant such as: sulfuric acid (H2SO4), perchloric acid (HClO4), hydroiodic acid (HI), hydrobromic acid (HBr), nitric acid (HNO3), hydrochloric acid (HCl), acetic acid (CH3COOH), citric acid (C6H8O7), potassium periodate (KIO4), tartaric acid (C4H6O6), benzoic acid (C6H5COOH), tetrafluoroboric acid (HBF4), carbonic acid (H2CO3), hydrogen cyanide (HCN), nitrous acid (HNO2), hydrofluoric acid (HF), or phosphoric acid (H3PO4). In some examples, an alkaline-based etchant may be used. Such etchants may include but are not limited to ammonium hydroxide (NH4OH) and potassium hydroxide (KOH).

Figure 3C:
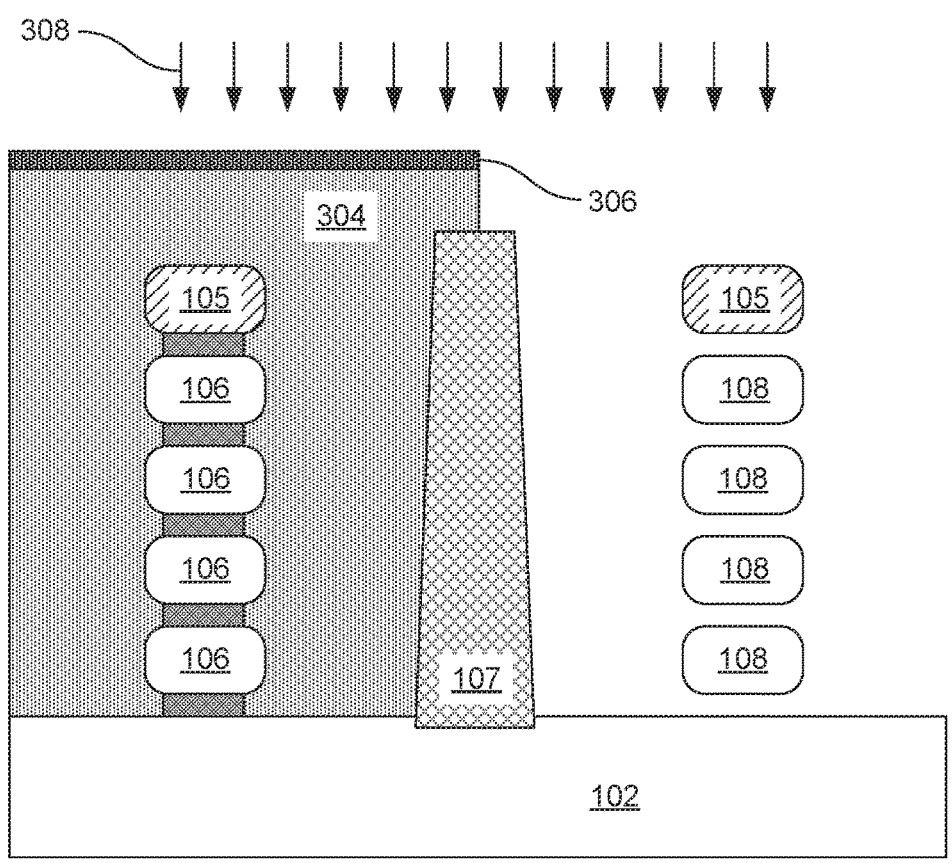

FIG. 3C illustrates a second etching process 308 that is applied to the n-type channel stack 103 to fully remove the first conductive material 202 from the spaces between the channels 108. Before the second etching process 308 is applied, a bottom anti-reflective coating (BARC) layer 304 may be deposited in the regions corresponding to p-type channel stacks. The wet etching process 308 may use either acid or alkaline-based etchants. The BARC layer 304 may be selected to have good adhesion to a high-k dielectric layer. For example, the BARC layer may include hafnium oxide (HfO2), lanthanum oxide (La2O3), or aluminum oxide (Al2O3). The BARC material may be selected so that wet etching processes as described herein remove less than 2 nanometers of the BARC layer.

A photoresist 306 may be placed on top of the BARC layer 304. The photoresist 306 may be used to photolithographically pattern the BARC layer 304. For example, the photoresist 306 may be exposed to a light source through a photomask. The photomask may then be developed such that the portions of the photoresist above the p-type regions remain while the portions above the n-type regions are removed. The exposed BARC layer may then be removed to expose the n-type channel stacks (e.g., 103).

Because the second wet etching process 308 removes the first conductive material 202 between the channels 108 and does not have to remove the first conductive material from the outside of the channels 108, the wet etching process is applied for a smaller period of time. Thus, it may do less damage to the BARC layer 304. Additionally, the amount of the first conductive material 202 that is along the sidewalls in the n-type region will be less affected. Thus, less of the first conductive material 202 along sidewalls in the n-type region will be inadvertently removed.

Figure 3D:
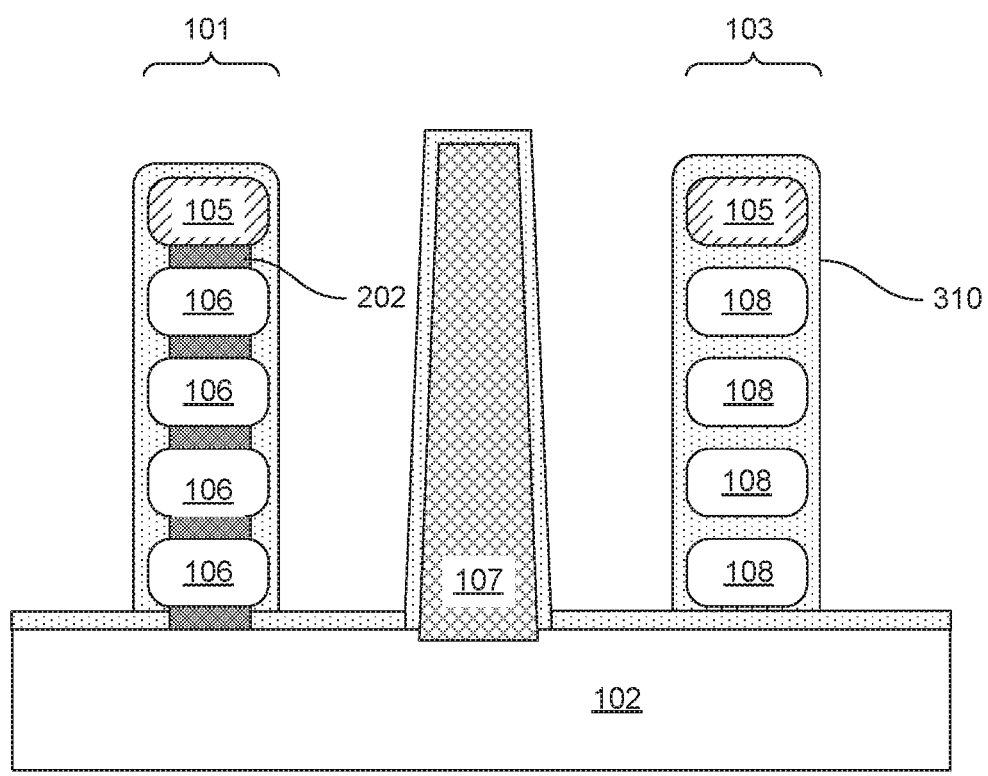

FIG. 3D illustrates the channel stacks 101, 103 after the BARC layer 304 has been removed and after a second conductive material 310 is deposited. The BARC layer 304 and the photoresist 306 may be removed using photolithographic processes to remove such layers. The second conductive material may be an n-type workfunction metal. Such metals may include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC).

In the p-type region, the second conductive material 310 surrounds the p-type channel stack 101 but is not positioned between the channels 106. This is because the space between the channels 106 is still filled with the first conductive material 202. In the n-type region, the second conductive material 310 is positioned in the spaces between the channels 108 of the n-type channel stack 103. And, the second conductive material 310 surrounds the n-type channel stack 103. Using the processes described herein, the p-type and n-type channel stacks can be formed with improved threshold voltages and less risk of damage to components during the fabrication process.

Figure 4:
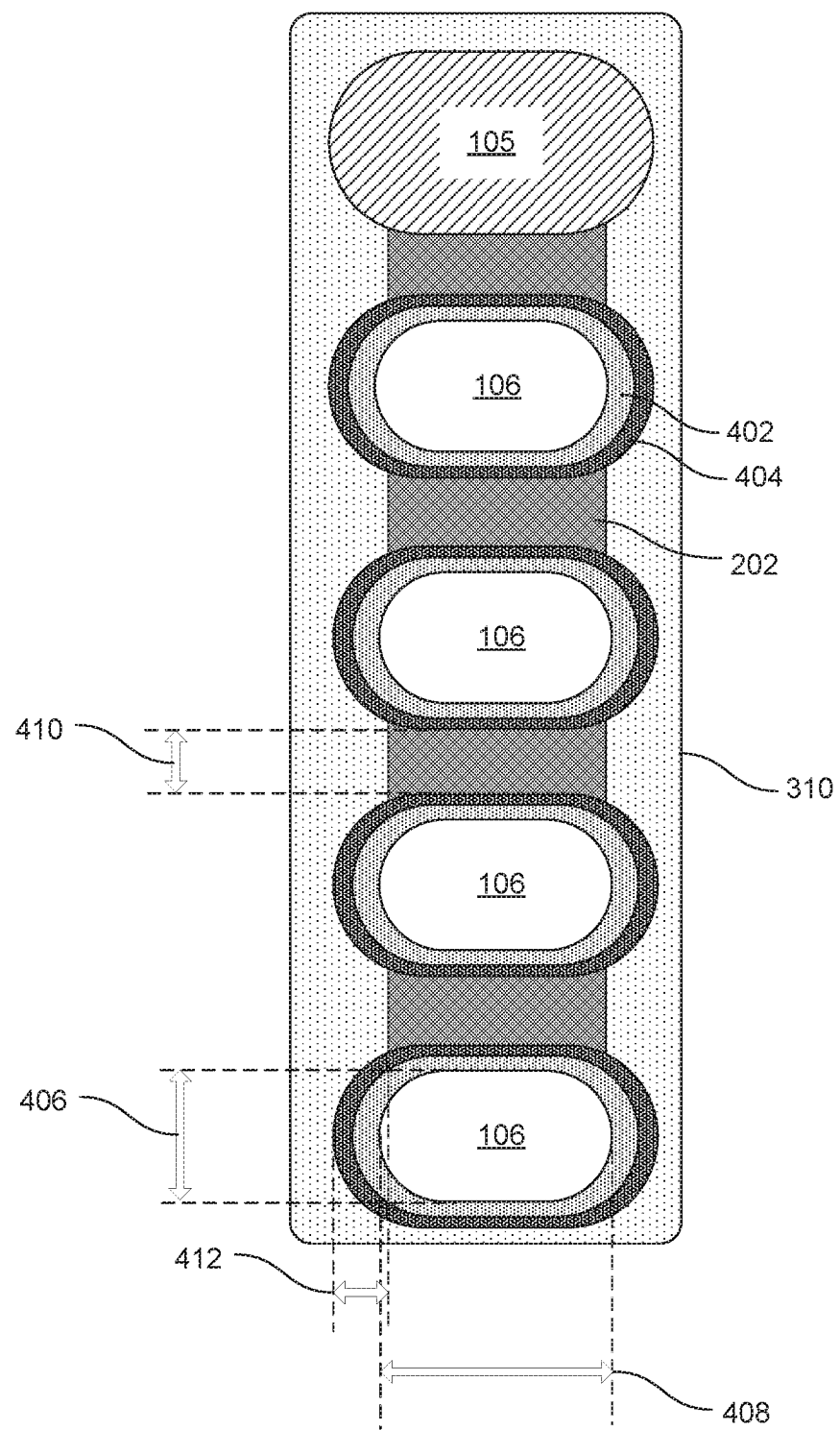
FIG. 4 is a diagram showing further detail of the nanostructure device, according to one example of principles described herein.

FIG. 4 is a diagram showing further detail of the nanostructure device. According to the present example, the channels 106 may be covered in an interfacial layer 402 and a high-k dielectric layer 404. The interfacial layer 402 provides better adhesion of the high-k dielectric layer to the semiconductor material of the channels 106. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

In some examples, the width 408 of the nanostructures may be within a range of about 2-6 nanometers. In some examples, the ratio of the width 408 to the height 406 may be within a range of 4-8. These ranges are ideal for nanosheet structures. If the nanosheets are too small they may be susceptible to breaking. If the nanosheets are too large they may take up too much space within the integrated circuit. In some examples, the spacing 410 between the sheets may be about 0.5-2 times the height 406 of the nanostructures. In some examples, the width of the hard mask 105 may be about 1-1.5 times the width 408 of the nanostructures. In some examples, the height 406 of the hard mask 105 may be about 0.5-2 times the height of the nanostructures. While the present example illustrates four nanostructures, other examples may have a channel stack that have between two and six nanostructures in each stack. In some examples, the distance 412 between the first conductive material 202 and the outer edge of the high-k dielectric layer 404 may be within a range of about 0-5 nanometers. If the distance 412 is larger than that range, then the manner in which the first conductive material 202 affects the work function may be reduced. In some examples, Local high Vt occurs at sheet edge but with portion of <25%. In some examples, Correct Vt locates in-between sheets with portion of >75%. These dimensions and ratios allow for optimal efficiency and performance of the circuitry to which the nanostructure device belongs.

Figure 5:
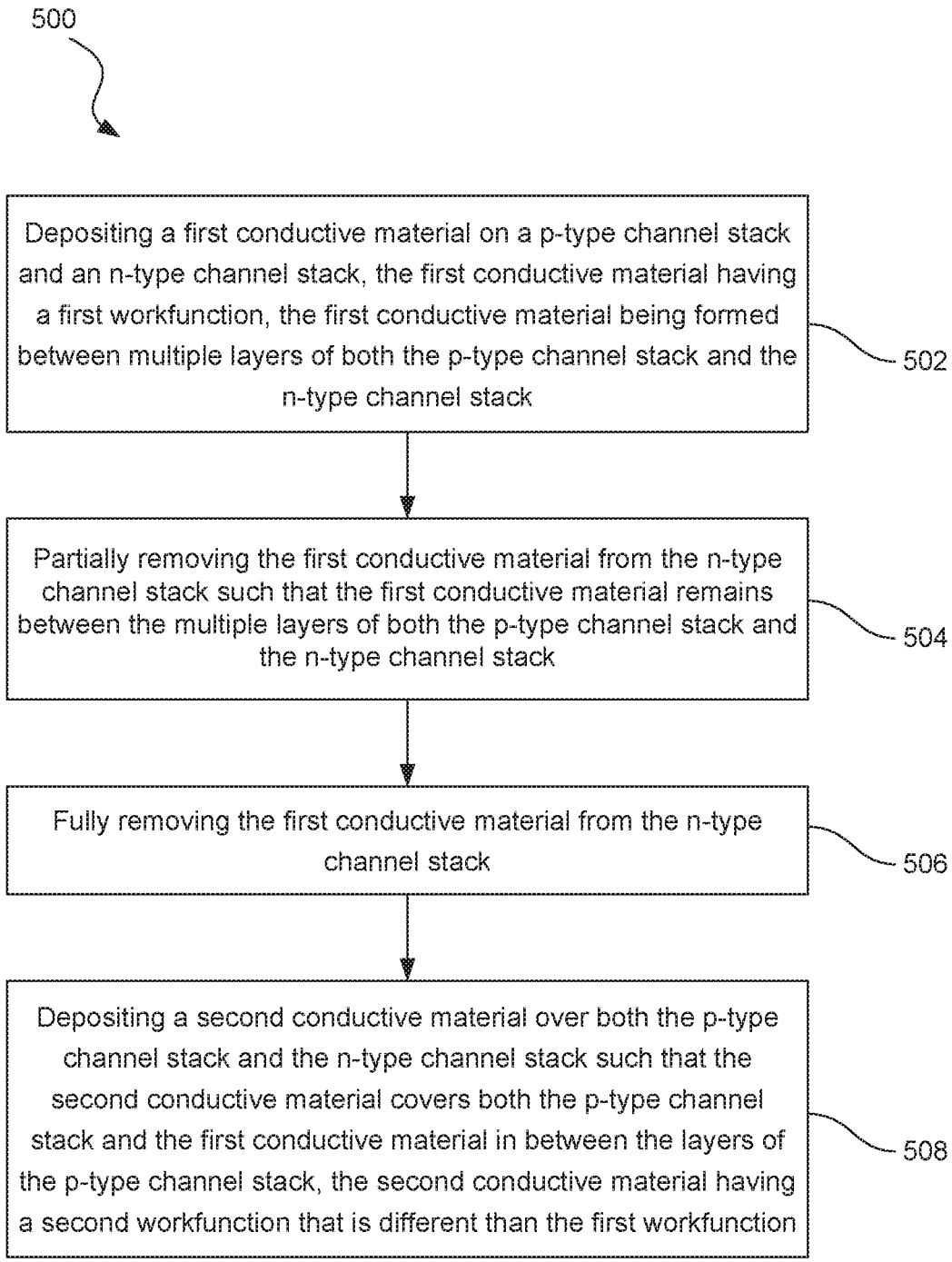
FIG. 5 is a flowchart showing an illustrative method for forming a mixed workfunction metal nanostructure device, according to one example of principles described herein.

FIG. 5 is a flowchart showing an illustrative method for forming a mixed workfunction metal nanostructure device. According to the present example, the method 500 includes a process 502 for depositing a first conductive material (e.g., 202) on a p-type channel stack (e.g., 101) and an n-type channel stack (e.g., 103). The first conductive material has a first workfunction. The first conductive material being formed between multiple layers of both the p-type channel stack and the n-type channel stack.

The first conductive material may be a p-type workfunction metal. Such metal is designed to give p-type metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc.

Each of the channel stacks may include a plurality of nanostructures such as nanosheets or nanowires. Each nanostructure may be surrounded by an interfacial layer (e.g., 402) and a high-k dielectric layer (e.g., 404). The channels may include at least one of the following materials: silicon (Si), silicon germanium (SiGe), germanium (Ge), gallium arsenic (GaAs), and indium phosphorous (InP).

The method 500 further includes a process 504 for partially removing the first conductive material from the n-type channel stack such that the first conductive material remains between the multiple layers of both the p-type channel stack and the n-type channel stack. This may be done, for example through a wet etching process. The etching process (e.g. 302) that is used to partially remove the first conductive material is applied long enough to remove the first conductive material around the outsides of the channel stacks but not long enough to remove it from between the channels. As can be seen, for example, in FIG. 3B, the first conductive material remains in the spaces between the channels. The wet etching process may use an acid-based etchant or an alkaline-based etchant.

The method 500 further includes a process 506 for fully removing the first conductive material from the n-type channel stack. This process may be, for example, a wet etching process (e.g., 308). Before the second etching process is applied, a bottom anti-reflective coating (BARC) layer may be deposited in the regions corresponding to p-type channel stacks. The wet etching process may use either acid or alkaline-based etchants. The BARC layer may be selected to have good adhesion to a high-k dielectric layer.

A photoresist may be placed on top of the BARC layer. The photoresist may be used to photolithographically pattern the BARC layer. For example, the photoresist may be exposed to a light source through a photomask. The photomask may then be developed such that the portions of the photoresist above the p-type regions remain while the portions above the n-type regions are removed. The exposed BARC layer may then be removed to expose the n-type channel stacks (e.g., 103).

Because the second wet etching process only removes the first conductive material between the channels, it is applied for a smaller period of time. Thus, it may do less damage to the BARC layer. Additionally, the amount of the first conductive material that is along the sidewalls in the n-type region will be less affected. Thus, less of the first conductive material along sidewalls in the n-type region will be inadvertently removed.

The method 500 further includes a process 508 for depositing a second conductive material over both the p-type channel stack and the n-type channel stack such that the second conductive material covers both the p-type channel stack and the first conductive material in between the layers of the p-type channel stack. The second conductive material may have a second workfunction that is different than the first workfunction.

In the p-type region, the second conductive material surrounds the p-type channel stack but is not positioned between the channels. This is because the space between the channels is still filled with the first conductive material. In the n-type region, the second conductive material is positioned in the spaces between the channels of the n-type channel stack 103. And, the second conductive material surrounds the n-type channel stack. Using the processes described herein, the p-type and n-type channel stacks can be formed with improved threshold voltages and less risk of damage to components during the fabrication process.

Figure 6:
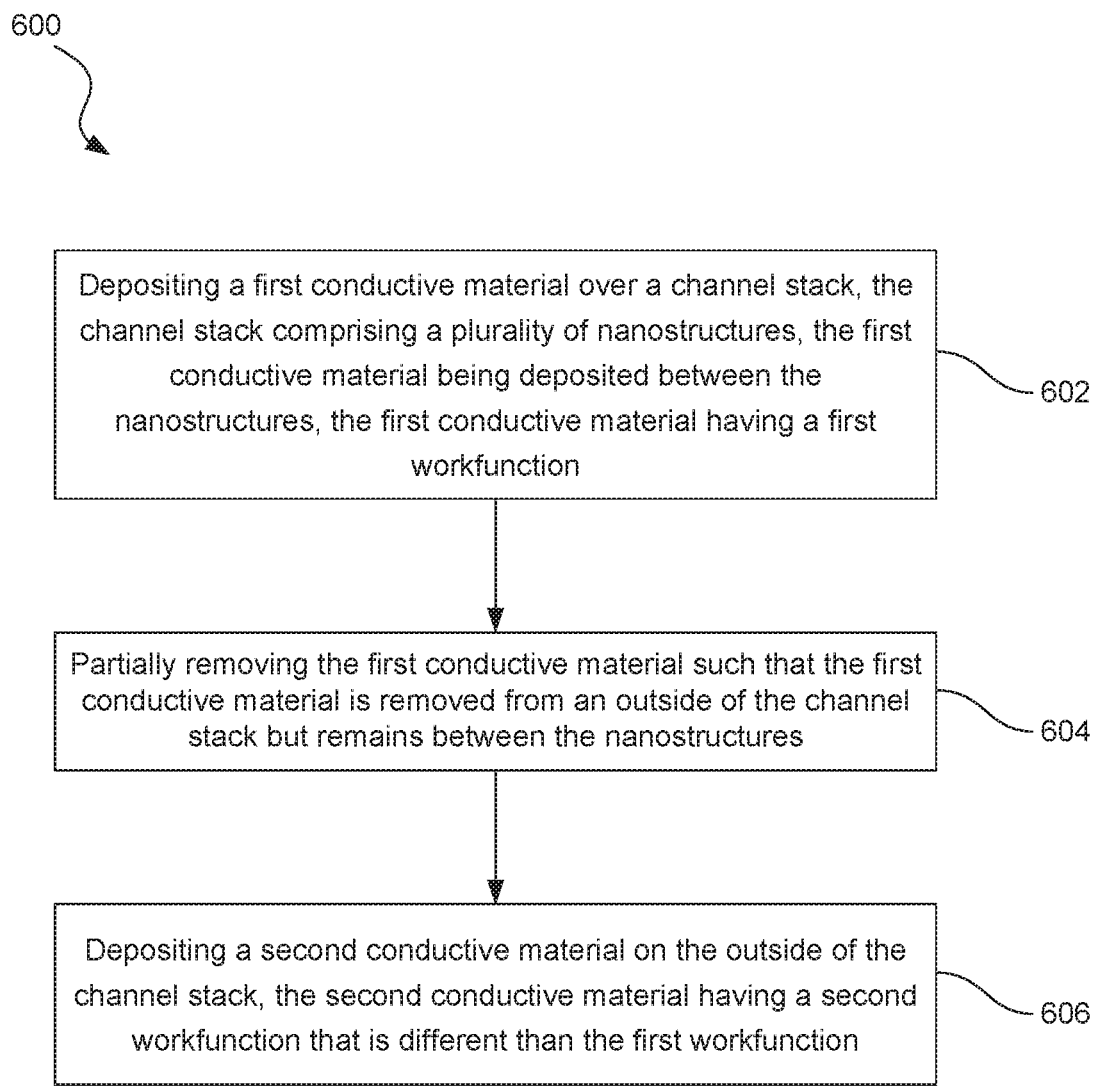
FIG. 6 is a flowchart showing an illustrative method for forming a mixed workfunction metal nanostructure device, according to one example of principles described herein.

FIG. 6 is a flowchart showing an illustrative method for forming a mixed workfunction metal nanostructure device. According to the present example, the method 600 includes a process 602 for depositing a first conductive material over a channel stack. The channel stack includes a plurality of nanostructures such as nanosheets or nanowires. Each of the nanostructures may be partially or fully surrounded by an interfacial layer and a high-k dielectric layer. In one example, the channel stack is a p-type channel stack. The first conductive material being deposited between the nanostructures may be a p-type workfunction metal layer.

The nanostructures, which may be referred to as channels (e.g., 106) may be formed using various techniques used to form GAA devices. For example, the channels may be formed by depositing a first type of semiconductor material within the space between the two active regions. Then, a second type of semiconductor material may be epitaxially grown. The process continues by forming alternating layers of the first and second semiconductor material. Then, a first etching process (e.g., a dry etching process) is used to cut the channel stack and expose each layer of the channel stack. Then, a second etching process (e.g., a wet etching process) can be used to remove the first semiconductor material while leaving the second semiconductor material substantially intact. The remaining second semiconductor material may thus form a stack of nanowires or nanosheets extending between two active regions. The channels may include at least one of the following materials: silicon (Si), silicon germanium (SiGe), germanium (Ge), gallium arsenic (GaAs), and indium phosphorous (InP).

The method 600 further includes a process 604 for partially removing the first conductive material such that the first conductive material is removed from an outside of the channel stack but remains between the nanostructures. The etching process (e.g., 302) that is used to partially remove the first conductive material may be an isotropic etching process such as a wet etching process. The etching process is applied long enough to remove the first conductive material around the outsides of the channels but not long enough to remove it from between the channels. As can be seen, the first conductive material remains in the spaces between the channels. The wet etching process may use an acid-based etchant such as: sulfuric acid (H2SO4), perchloric acid (HClO4), hydroiodic acid (HI), hydrobromic acid (HBr), nitric acid (HNO3), hydrochloric acid (HCl), acetic acid (CH3COOH), citric acid (C6H8O7), potassium periodate (KIO4), tartaric acid (C4H6O6), benzoic acid (C6H5COOH), tetrafluoroboric acid (HBF4), carbonic acid (H2CO3), hydrogen cyanide (HCN), nitrous acid (HNO2), hydrofluoric acid (HF), or phosphoric acid (H3PO4). In some examples, an alkaline-based etchant may be used. Such etchants may include but are not limited to ammonium hydroxide (NH4OH) and potassium hydroxide (KOH).

The method 600 further includes a process 606 for depositing a second conductive material on the outside of the channel stack. The second conductive material has a second workfunction that is different than the first workfunction. Before the second conductive material is deposited, a second etching process 308 that is applied to n-type channel stacks to fully remove the first conductive material from the spaces between the channels of the n-type channel stacks. Before the second etching process is applied, a BARC layer may be deposited in the regions corresponding to p-type channel stacks. The second etching process may use either acid or alkaline-based etchants. The BARC layer may be selected to have good adhesion to a high-k dielectric layer. For example, the BARC layer may include hafnium oxide (HfO2), lanthanum oxide (La2O3), or aluminum oxide (Al2O3). The BARC material may be selected so that wet etching processes as described herein remove less than 2 nanometers of the BARC layer.

Because the second wet etching process 308 removes the first conductive material 202 between the channels 108 and does not have to remove the first conductive material from the outside of the channels 108, the wet etching process is applied for a smaller period of time. Thus, it may do less damage to the BARC layer. Additionally, the amount of the first conductive material that is along the sidewalls in the n-type region will be less affected. Thus, less of the first conductive material along sidewalls in the n-type region will be inadvertently removed.

The second conductive material may be an n-type workfunction metal. Such metals may include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC).

In the p-type region, the second conductive material surrounds the p-type channel stack but is not positioned between the channels. This is because the space between the channels is still filled with the first conductive material. In the n-type region, the second conductive material is positioned in the spaces between the channels of the n-type channel stack. And, the second conductive material surrounds the n-type channel stack. Using the processes described herein, the p-type and n-type channel stacks can be formed with improved threshold voltages and less risk of damage to components during the fabrication process.

According to one example, a method includes depositing a first conductive material on a first-type channel stack and a second-type channel stack, the first conductive material having a first workfunction, the first conductive material being formed between multiple layers of both the first-type channel stack and the second-type channel stack. The method further includes partially removing the first conductive material from the second-type channel stack such that the first conductive material remains between the multiple layers of both the first-type channel stack and the second-type channel stack and fully removing the first conductive material from the second-type channel stack. The method further includes depositing a second conductive material over both the first-type channel stack and the second-type channel stack such that the second conductive material covers both the first-type channel stack and the first conductive material in between the layers of the first-type channel stack, the second conductive material having a second workfunction that is different than the first workfunction.

According to one example, a method includes depositing a first conductive material over a channel stack, the channel stack comprising a plurality of nanostructures, the first conductive material being deposited between the nanostructures, the first conductive material having a first workfunction. The method further includes partially removing the first conductive material such that the first conductive material is removed from an outside of the channel stack but remains between the nanostructures. The method further includes depositing a second conductive material on the outside of the channel stack, the second conductive material having a second workfunction that is different than the first workfunction.

According to one example, a semiconductor structure includes a first channel stack having a first workfunction metal positioned between a plurality of nanostructures and a second workfunction metal surrounding the first channel stack, the second workfunction metal being different than the first workfunction metal. The structure further includes a second channel stack having the second workfunction metal surrounding second channel stack and being formed between nanostructures of the second channel stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a first conductive material on a first-type channel stack and a second-type channel stack, the first conductive material having a first workfunction, the first conductive material being formed between multiple layers of both the first-type channel stack and the second-type channel stack;
partially removing the first conductive material from the second-type channel stack such that the first conductive material remains between the multiple layers of both the first-type channel stack and the second-type channel stack;
fully removing the first conductive material from the second-type channel stack; and
depositing a second conductive material over both the first-type channel stack and the second-type channel stack such that the second conductive material covers both the first-type channel stack and the first conductive material in between the layers of the first-type channel stack, the second conductive material having a second workfunction that is different than the first workfunction.

2. The method of claim 1, wherein partially removing the first conductive material comprises a wet etching process.

3. The method of claim 1, wherein fully removing the first conductive material comprises a wet etching process.

4. The method of claim 1, wherein the first conductive material includes at least one of: WCN, TaN, TiN, TiAlN, TSN, W, Co, or Mo.

5. The method of claim 1, wherein the second conductive material comprises at least one of: Al, TiAl, TiAlC, TiAlSiC, TaAlSiC, or HfC.

6. The method of claim 1, wherein the first-type channel stack includes a set of nanosheets.

7. The method of claim 6, wherein each of the nano sheets has a height within a range of 2-6 nanometers.

8. The method of claim 7, wherein the nanosheets have a width to height ratio within a range of about 4-8.

9. The method of claim 8, wherein a number of nanosheets in the first-type channel stack is within a range of 2-6.

10. The method of claim 6, wherein the nanosheets are surrounded by an interfacial layer and a dielectric layer.

11. A method comprising:
depositing a first conductive material over a channel stack, the channel stack comprising a plurality of nanostructures, the first conductive material being deposited between the nanostructures, the first conductive material having a first workfunction;
partially removing the first conductive material such that the first conductive material is removed from an outside of the channel stack but remains between the nanostructures; and
depositing a second conductive material on the outside of the channel stack, the second conductive material having a second workfunction that is different than the first workfunction.

12. The method of claim 11, wherein the channel stack is part of a first-type transistor device.

13. The method of claim 11, wherein partially removing the first conductive material utilizes an alkaline-based wet etching process.

14. The method of claim 11, wherein partially removing the first conductive material utilizes an acid-based wet etching process.

15. The method of claim 11, further comprising, while partially removing the first conductive material from the channel stack, partially removing the first conductive material from an second-type channel stack.

16. The method of claim 15, further comprising, fully removing the first conductive material from the second-type channel stack.

17. The method of claim 16, wherein the channel stack is covered with a bottom anti-reflective coating (BARC) layer and a photoresist layer.

18. A semiconductor structure comprising:
a first channel stack having a first workfunction metal positioned between a plurality of nanostructures and a second workfunction metal surrounding the first channel stack, the second workfunction metal being different than the first workfunction metal;
a second channel stack having the second workfunction metal surrounding second channel stack and being formed between nanostructures of the second channel stack.

19. The structure of claim 18, wherein the first channel stack comprises at least one of: Si, SiGe, Ge, GaAs, or InP.

20. The structure of claim 18, further comprising, a dielectric barrier structure positioned between the first channel stack and the second channel stack.

* * * * *